United States Patent
Arikan

(10) Patent No.: US 9,148,177 B2
(45) Date of Patent: Sep. 29, 2015

(54) METHOD AND SYSTEM FOR ERROR CORRECTION IN TRANSMITTING DATA USING LOW COMPLEXITY SYSTEMATIC ENCODER

(71) Applicant: POLARAN YAZILIM BILISIM DANISMANLIK ITHALAT IHRACAT SANAYI TICARET LIMITED SIRKETI, Ankara (TR)

(72) Inventor: Erdal Arikan, Ankara (TR)

(73) Assignee: Polaran Yazilim Bilisim Danismanlik Ithalat Ihracat Sanayi Ticaret Limited Sirketi, Ankara (TR)

(*) Notice: Subject to any disclaimer, the term of this patent is extended or adjusted under 35 U.S.C. 154(b) by 0 days.

(21) Appl. No.: 14/706,795

(22) Filed: May 7, 2015

(65) Prior Publication Data
US 2015/0244497 A1   Aug. 27, 2015

Related U.S. Application Data

(62) Division of application No. 13/597,765, filed on Aug. 29, 2012, now Pat. No. 9,059,739, which is a division of application No. 13/450,775, filed on Apr. 19, 2012, now Pat. No. 8,347,186.

(51) Int. Cl.
| | |
|---|---|
| H03M 13/00 | (2006.01) |
| H04L 1/00 | (2006.01) |
| H03M 13/13 | (2006.01) |
| H03M 13/11 | (2006.01) |

(52) U.S. Cl.
CPC ........ *H03M 13/615* (2013.01); *H03M 13/1148* (2013.01); *H03M 13/13* (2013.01); *H03M 13/611* (2013.01); *H04L 1/0041* (2013.01)

(58) Field of Classification Search
CPC ............ H03M 13/615; H03M 13/611; H03M 13/1148; H03M 13/13
See application file for complete search history.

(56) References Cited

U.S. PATENT DOCUMENTS

| | | | | |
|---|---|---|---|---|
| 3,465,287 | A * | 9/1969 | Sorg, Jr. et al. | 714/762 |
| 3,703,705 | A * | 11/1972 | Patel | 714/757 |
| 4,052,698 | A * | 10/1977 | Ragle | 714/757 |
| 4,312,069 | A * | 1/1982 | Ahamed | 714/757 |
| 4,410,989 | A * | 10/1983 | Berlekamp | 714/762 |
| 5,517,508 | A * | 5/1996 | Scott | 714/776 |
| 7,003,715 | B1 * | 2/2006 | Thurston | 714/782 |

* cited by examiner

*Primary Examiner* — Joseph D Torres
(74) *Attorney, Agent, or Firm* — John L. Rogitz

(57) ABSTRACT

A systematic encoder such as a systematic polar encoder for channel encoding to ameliorate the effects of noise in a transmission channel. The codeword carries a data word to be transmitted transparently, and also carries a parity part derived from the data word and a fixed word. Implementations advantageously reduce coding complexity to the order of N log(N), wherein N is the dimension of a matrix of the nth Kronecker power associated with a matrix effectively employed by the encoder.

3 Claims, 12 Drawing Sheets

Systematic encoder (G, A, B, b)

| Parameter | Size | Constraint |
|---|---|---|
| Transform matrix G | $N \times N$ | Submatrix $G_{AB}$ must be invertible |
| Row index set A | $K$ | $A \subset \{1,...,N\}$ |
| Column index set B | $K$ | $A \subset \{1,...,N\}$ |
| Fixed word b | $N - K$ | |

$$D = (G_{AB})^{-1} G_{AB^c}$$ —331

$$c = b \left[ G_{A^c B^c} - G_{A^c B}(G_{AB})^{-1} G_{AB^c} \right]$$ —332

$$G = F^{\otimes n} \quad 510$$

$$F = \begin{bmatrix} 1 & 0 \\ 1 & 1 \end{bmatrix} \quad 520$$

$$G = F \otimes G_1 \quad 511$$

$$G_1 = F \otimes G_2 \quad 512$$

$$G_1 = F_1 \otimes F_2 \otimes \cdots \otimes F_n \quad 530$$

$$G_j = F_{j+1} \otimes \cdots \otimes F_n \quad 531$$

669 — $\mathbf{b}^{(1)} = \mathbf{b}_{[N/2-K_2+1, N-K]}$

670 — $\mathbf{b}^{(2)} = \mathbf{b}_{[1, N/2-K_2]}$

681 — $\mathbf{d}^{(1)} = \mathbf{d}_{[K_2+1, K]}$

682 — $\mathbf{d}^{(2)} = \mathbf{d}_{[1, K_2]} - \left(\mathbf{x}^{(1)}\right)_{B^{(2)}}$ 683 — $\mathbf{x} = \left(\mathbf{x}^{(1)} + \mathbf{x}^{(2)}, \mathbf{x}^{(1)}\right)$

FIG. 6B

| | Existing knowledge | | | | New knowledge extraction rule |
|---|---|---|---|---|---|
| | $\alpha_1$ | $\alpha_2$ | $\beta_1$ | $\beta_2$ | |
| Rule 1 | U | U | U | U | Do nothing |
| Rule 2 | U | U | U | K | $\alpha_2 \leftarrow \beta_2$ |
| Rule 3 | U | U | K | U | Do nothing |
| Rule 4 | U | U | K | K | $\alpha_2 \leftarrow \beta_2$, $\alpha_1 \leftarrow \beta_1 \oplus \beta_2$ |
| Rule 5 | U | K | U | U | $\beta_2 \leftarrow \alpha_2$ |
| Rule 6 | U | K | U | K | $\alpha_1 \leftarrow \alpha_2 \oplus \beta_2$, $\beta_1 \leftarrow \alpha_2 \oplus \beta_2$ |
| Rule 7 | U | K | K | U | $\alpha_1 \leftarrow \beta_1 \oplus \beta_2$ |
| Rule 8 | U | K | K | K | Do nothing |
| Rule 9 | K | U | U | U | $\alpha_2 \leftarrow \beta_2$, $\beta_1 \leftarrow \alpha_1 \oplus \beta_2$ |
| Rule 10 | K | U | U | K | $\alpha_2 \leftarrow \alpha_1 \oplus \beta_1$, $\beta_2 \leftarrow \alpha_1 \oplus \beta_1$ |
| Rule 11 | K | U | K | U | $\alpha_2 \leftarrow \beta_2$ |
| Rule 12 | K | U | K | K | Do nothing |
| Rule 13 | K | K | U | U | $\beta_2 \leftarrow \alpha_2$, $\beta_1 \leftarrow \alpha_1 \oplus \alpha_2$ |
| Rule 14 | K | K | U | K | $\beta_1 \leftarrow \alpha_1 \oplus \alpha_2$ |
| Rule 15 | K | K | K | U | $\beta_2 \leftarrow \alpha_2$ |
| Rule 16 | K | K | K | K | Do nothing |

| Index to array element | State at time 1 | | | | State at time 2 | | | | State at time 3 | | | | State at time 4 | | | | State at time 5 | | | | State at time 6 | | | |
|---|---|---|---|---|---|---|---|---|---|---|---|---|---|---|---|---|---|---|---|---|---|---|---|---|
| | u | v | w | x | u | v | w | x | u | v | w | x | u | v | w | x | u | v | w | x | u | v | w | x |
| 1 | 0 | | | | 0 | | | | 0 | 1 | 0 | | 0 | 1 | 0 | | 0 | 0 | 0 | 1 | 0 | 1 | 0 | 0 |
| 2 | 1 | | | | 1 | 1 | 0 | | 1 | 1 | 0 | 1 | 1 | 1 | 0 | 1 | 1 | 1 | 0 | 0 | 1 | 1 | 0 | 1 |
| 3 | 0 | | | | 0 | 1 | 1 | 0 | 0 | 1 | 1 | 0 | 0 | 1 | 1 | 0 | 0 | 1 | 1 | 1 | 0 | 1 | 1 | 1 |
| 4 | | | | 0 | 0 | 1 | 1 | 1 | 1 | 1 | 0 | 0 | 1 | 1 | 1 | 1 | 1 | 1 | 1 | 0 | 1 | 0 | 0 | 0 |
| 5 | | | | | | | | | 0 | 0 | 0 | 1 | 0 | 0 | 0 | 1 | 0 | 0 | 0 | 1 | 0 | 0 | 0 | 0 |
| 6 | | | | 1 | 0 | 1 | 0 | 1 | 0 | 0 | 0 | 1 | 0 | 0 | 1 | 0 | 0 | 0 | 1 | 0 | 0 | 0 | 1 | 0 |
| 7 | | | | 0 | 0 | 0 | 0 | 1 | 1 | 0 | 0 | 1 | 1 | 0 | 0 | 0 | 0 | 0 | 0 | 0 | 1 | 0 | 0 | 0 |
| 8 | | | | 1 | 0 | 1 | 1 | 1 | 1 | 1 | 1 | 1 | 1 | 1 | 1 | 1 | 1 | 1 | 1 | 1 | 1 | 1 | 1 | 1 |

790

US 9,148,177 B2

METHOD AND SYSTEM FOR ERROR CORRECTION IN TRANSMITTING DATA USING LOW COMPLEXITY SYSTEMATIC ENCODER

FIELD OF THE INVENTION

The present application relates generally to error correction, and more particularly to providing a low complexity systematic encoder for error correction using polar codes.

BACKGROUND

In modem digital data transmission (wireless telephony, wireless data transmission, optical disk transmission to a player, music players receiving music data, and so on), a source encoder can compress the data to be transmitted for efficiency and then a channel encoder can receive the compressed data and add redundancy to it to protect the data against noise in the transmission channel. The receiver (sometimes referred to as the "sink") at the other end of the channel receives the encoded data and uses a channel decoder to perform the inverse of channel encoding, followed by a source decoder which performs the inverse of source encoding. The decoded information is then played by the sink, e.g., by an optical disk player or music player or receiving telephone as audio, or is otherwise used and/or stored by the receiver.

Present principles focus on channel encoding. Channel encoding typically works by sending a piece of data sought to be communicated, referred to as a "data word", through a transformation to produce a "code word" that is better protected against errors than the data word from which it is derived and thus is more suitable for transmission than the data word. For present purposes suffice it to say that linear block encoders, which multiply a data word using a matrix, have been used for this purpose because they are able to achieve an acceptable tradeoff of offering significant (albeit not absolute) protection against noise, commonly expressed in terms of the error rates such as bit error rates (BER) that result from noise, while being of sufficiently "low complexity" in terms of the amount of computation they require. Higher complexity encoding schemes that reduce the BER of a received signal hut require too much computation for expected data transmission rates are of little practical use.

A newer type of linear block code is the polar code, which improves on older codes by being able to achieve channel capacity, i.e., by being able to encode data such that the full capacity of the transmission channel can be exploited. Channel polarization refers to the fact that given a binary-input discrete memoryless channel W with symmetric capacity I(W), it is possible to synthesize, out of N independent copies of W, a second set of N binary-input channels $W_N^{(i)}$, $1 \le i \le N$ such that as N becomes large, a fraction I(W) of the synthesized channels become near perfect while the remaining fraction of channels become near useless. Codes constructed on the basis of this idea are called polar codes. Non-systematic polar encoders effect polar coding by collecting an input data word d and a fixed word b into a transform input word u and by multiplying it with a transform matrix G to render a code word x, i.e., x=uG.

The transform matrix G used in polar codes is based on Kronecker products, and its dimension is established as appropriate for the desired channel rate or capacity. Polar coding essentially amounts to selecting some of the elements of the transform input word U to carry the data word d while "freezing" (not using for encoding) the remainder of the elements of the transform input word. The elements of the transform input word that are selected to carry the data word d are those that in effect "see" the relatively good channels created by channel polarization, while the elements of b that are frozen "see" the relatively had channels. In my paper which introduced polar codes, entitled "Channel Polarization: A Method for Constructing Capacity-Achieving Code for Symmetric Binary-Input Memoryless Channels", *IEEE Trans. Inf. Theory*, volume 55, pages 3051-3073 (July 2009), incorporated herein by reference and included in the file history of this application, I describe how to carry out channel polarization and transmit data using the "good" channels.

The problem sought to be addressed by present principles is as follows. The polar codes described in the above-referenced paper are non-systematic polar codes, meaning that the information bits do not appear as part of the code word transparently. Systematic codes in general, in which information bits appear as part of the code word transparently, can provide better error reduction performance than their non-systematic counterparts.

As recognized herein, however, conventional techniques cannot be used to transform a non-systematic polar code into a systematic polar code because doing so destroys the requisite recursive structure of the Kronecker power-based transform matrix G typically used in polar codes, which in turn implicates an unacceptably high encoder complexity. Present principles critically recognize that a systematic encoder for polar codes desired to maximize channel capacity exploitation, maximize immunity from noise, while exhibiting a low computation complexity to enable it to feasibly operate in expected data transmission environments.

SUMMARY OF THE INVENTION

This disclosure describes a systematic variant of polar coding complete with an encoder and decoder that preserves the low-complexity properties of standard non-systematic polar coding while significantly improving its bit-error rate (BER) performance.

Embodiments of the invention present methods, apparatuses and systems for deriving and implementing channel encoding and decoding algorithms that perform near the Shannon limit with low computational complexity. These embodiments may be implemented in communication systems, in mass storage devices and in other systems that will be apparent to those of ordinary skill in the art. Present principles may be reflected at least in part in my paper entitled "Systematic Polar Coding", *IEEE Communications Letters*, volume 15, pages 860-862 (August 2011), incorporated herein by reference and included in the file history of this application.

Accordingly, an encoding assembly is implemented by an electrical circuit or by a processor accessing a computer readable storage medium storing instructions executable by the processor to implement a coding circuit to establish a systematic encoder for a code C to encode data prior to transmission of the data to ameliorate the effects of noise. The code C is an affine subspace of a range space of a transform G, and the transform G has a form $P(F_1 \otimes G_1)Q$, wherein P is a row-permuter, $F_1$ is a first kernel transform, $G_1$ is a first-tier transform, and Q is a column permuter. The row permuter is a permutation matrix and likewise the column permuter is a permutation matrix. According to this aspect, the first kernel transform $F_1$ has a size greater than one, while the first-tier transform has a size smaller than a size of the transform G. The coding circuit being configured to derive from an input data word d a plurality of first-tier data words $d^{(1)}, \ldots, d^{(k)}$ to be encoded into a plurality of respective first-tier code words $x^{(1)}, \ldots, x^{(k)}$. The plurality of code words belong to a plurality of respective first-tier codes $C_1, \ldots C_k$, with the plurality of first-tier codes being equal to respective first-tier affine subspaces of the first-tier transform $G_1$. For each i from 1 to k, the circuit carries out systematic encoding of the ith first-tier data word $d^{(i)}$ into an ith first-tier code word $x^{(i)}$. The ith first-tier code word $x^{(i)}$ belongs to the ith first-tier code $C_1$. Furthermore, the coding circuit combines the plurality of first-tier code words $x^{(1)}, \ldots, x^{(k)}$ to obtain the code word x. In this way, systematic encoding for the code C is accomplished at low-complexity due to effective reduction of a given systematic encoding problem instance for the code C into a plurality of systematic encoding problem instances for the plurality of first-tier codes $C_1, \ldots C_k$, with each code in the plurality of first-tier codes being smaller than the code C.

In example embodiments, a transmitter receives the code word from the encoding circuit and transmits the code word to a receiver system. If desired, the coding circuit may be implemented by a sequential logic circuit. In a specific example described further below, the encoding assembly is implemented by an electrical circuit including logic gates and memory arrays.

In some examples, the first-tier transform $G_1$ is the Kronecker product of a plurality of kernel transforms: $G_1 = F_2 \otimes \ldots \otimes F_n$, wherein each of the plurality of kernel transforms has a size greater than one. Indeed, if desired $F_i = F_1$, for all $2 \le i \le n$, and in a specific instance $$F_i = \begin{bmatrix} 1 & 0 \\ 1 & 1 \end{bmatrix}.$$

In another aspect, a systematic encoder includes a machine-implemented circuit establishing a systematic encoder that encodes data words into code words and that has a complexity of no more than a constant multiple of N log(N), wherein N is the dimension of a matrix of the nth Kronecker power associated with a matrix effectively employed by the encoder. The encoder transmits the code words as robust representations of the data words to a receiver system for retrieval of the data words from the code words by the receiver system.

In another aspect, a systematic encoder assembly of low complexity has an input receiving data symbols sought to be transmitted. The assembly accesses at least one fixed word that does not change from transmission to transmission. A circuit of the assembly receives the data symbols and the fixed word and uses the data symbols to define systematic parts of code words. The circuit also uses the fixed word to define a fixed part of an input word which establishes a parity part of a code word. The circuit outputs, for transmission, code words transparently encapsulating data symbols and including respective parity parts.

In another aspect, a systematic encoder assembly includes a parallelized hardware implementation of a systematic encoder. In this aspect, the parallelized hardware implementation includes a circuit configured for a transform G. This circuit contains memory and is configured for implementing local constraints. According to this aspect, the circuit propagates knowledge between parts of the memory by way of the local constraints. The circuit is initialized by a loading a data word into the memory, and the knowledge in the circuit initially includes a knowledge of the data word and a knowledge of a fixed word. The local constraints are used to gain new knowledge from existing knowledge iteratively according to a schedule of calculations, so that the memory can be updated in accordance with the new knowledge to derive a parity word such that a combination of the parity word and the data word is output as a code word for transmission thereof as a robust transform of the data word.

The details of current embodiments, both as to structure and parts, can best be understood in reference to the accompanying figures, in which like figures refer to like parts, and in which:

BRIEF DESCRIPTION OF THE DRAWINGS

FIG. 3 is a schematic diagram showing the parameterization and functional characterization of the present systematic encoders;

FIG. 5 is a schematic diagram showing a non-limiting example Kronecker power construction of transforms, including as a special case transforms for polar codes;

FIGS. 6A and 6B illustrate a specific algorithm showing the decomposition of a non-limiting systematic encoding problem instance into two systematic encoding problem instances of smaller size by taking advantage of the Kronecker product structure of the transform defining the original problem;

FIGS. 7A, 7B, and 7C are block diagrams of a circuit and the control logic of the circuit showing a non-limiting example of parallelized hardware implementation of the present systematic polar encoder that can undertake the operation of FIG. 6;

DETAILED DESCRIPTION OF THE PREFERRED EMBODIMENT

Figure 1:
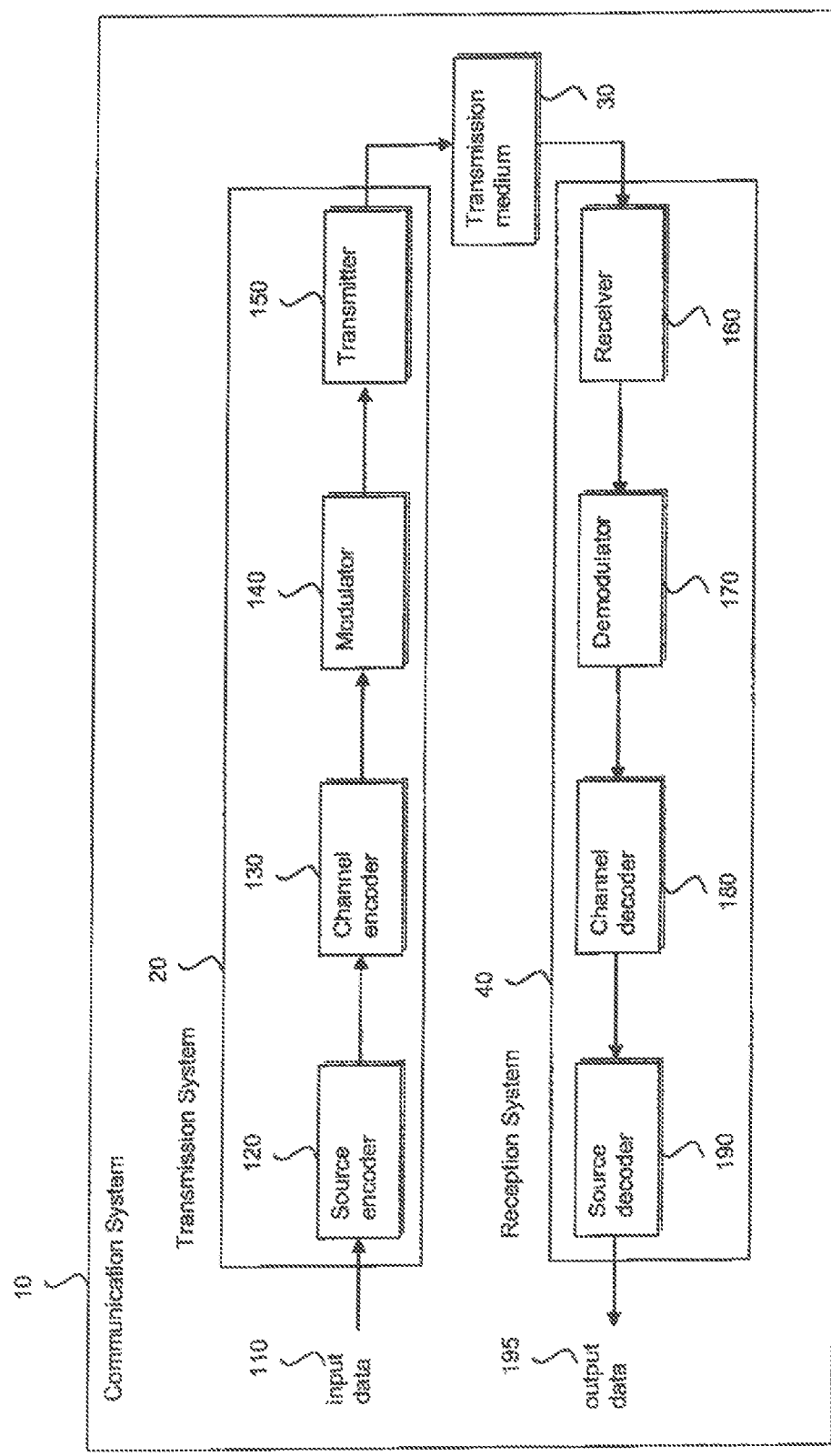
FIG. 1 is a block diagram of an example communication system that can use the present systematic encoder.

In accordance with established conventions in coding theory, data words, parity words, and code words in the system, are represented herein as vectors over a finite field $F_q$ where q denotes the number of elements in the field. Field elements (scalars) are denoted by plain lower case letters, such as $\alpha \in F_1$. Vectors over a field are denoted by lower-case boldface letters, such as $a \in F_q^N$ where N denotes the length of the vector. The notation $\alpha_i$ denotes the ith coordinate of a vector a. A vector $a \in F_q^N$ is alternatively denoted in terms of its elements as $(\alpha_1, \ldots \alpha_N)$ or $(\alpha_i: 1 \le i \le N)$. Matrices over a field are denoted by upper-case boldface letters, such as $A \in F_q^{M \times N}$ where M denotes the number of rows and N denotes the number of columns of A. The notation $\alpha_{i,j}$ denotes the element in the ith row and jth column of A. A matrix $A \in F_q^{M \times N}$ is denoted in terms of its elements as $(\alpha_{i,j}: 1 \le i \le M, 1 \le j \le N)$. The size of a matrix A is defined as the number of elements in A; thus, the size of a matrix with M rows and N columns is MN.

Sets are denoted by Italic upper-case letters such as A, B. If A is a set specified as a subset of a universal set U, then the notation $A^c$ denotes the complement of the set. A in the universal set, i.e., $A^c=\{\alpha \in U : \alpha \notin A\}$. The number of elements in set A is denoted as $|A|$. For r and s any two integers, with $r \le s$, the set $(r, r+1, \ldots s)$ is alternatively denoted as $[r, s]$; this is the set of all integers i such that $r \le i \le s$.

For $a \in F_q^N$ and $A \subset \{1, \ldots, N\}$, the notation $a_A$ denotes the sub-vector of a consisting of those elements $\alpha_i$ with indices in A: $a_A = (\alpha_i : i \in A)$. Likewise, $a_{A^c}$ denotes the sub-vector $a_{A^c} = (\alpha_i : i \in A^c)$. For example, if $a=(\alpha_1, \alpha_2, \alpha_3, \alpha_4)$ and $A=\{2,4\}$, then $a_A = (\alpha_2, \alpha_4)$ and $a_{A^c} = (\alpha_1, \alpha_3)$.

For $A \in F_q^{M \times N}$, $A \in \{1, 2, \ldots, M\}$, and $B \subset \{1, 2, \ldots, N\}$, the notation $A_{AB}$ denotes the sub-matrix of A consisting of elements $\alpha_{i,j}$ with $i \in A$, $j \in B$, that is, $A_{AB} = (\alpha_{i,j} : i \in A, j \in B)$. The product of a row vector $a \in F_q^m$ and a matrix $A \in F_q^{m \times n}$ is denoted as aA. The Kronecker product of two matrices $A \in F_q^{m \times n}$ and $B \in F_q^{k \times l}$ is defined as:

$$A \otimes B = \begin{bmatrix} a_{1,1}B & a_{1,2}B & \ldots & a_{1,r}B \\ a_{2,1}B & a_{2,2}B & \ldots & a_{2,r}B \\ \vdots & \vdots & \ddots & \vdots \\ a_{m,1}B & a_{m,2}B & \ldots & a_{m,r}B \end{bmatrix}$$

which is a mk-by-rl matrix. A matrix C is said to factorize into a Kronecker product of a matrix A and B if $C = A \otimes B$. The nth Kronecker power of a matrix A is defined recursively as $A^{\otimes n} = A \otimes A^{\otimes (n-1)}$ for $n \ge 2$, with $A^{\otimes 1} = A$.

Encoding operations comprise various transformations of vector representations of data words, parity words, and code words. The term "transform" is used below to refer to linear vector space transformations. Transforms are represented by matrices. Transforms are usually cited below together with a specific matrix representation; for example, "transform G" refers to a transform that is represented by the matrix G in a specific basis.

With the above in mind, initially referring to FIG. 1, a communication system 10 is shown in which embodiments of the present invention may be used. As shown, the communication system 10 includes a transmission system 20, which transmits encoded and modulated data into a transmission medium 30. Further, the system 10 includes a reception system 40, which receives, demodulates and decodes the transmitted data that is received from the transmission medium 30.

It is to be understood that present principles apply to various transmission systems and media. For example, in a wireless communication system, the transmission medium 30 typically is space or the atmosphere, in which case the communication system 10 is a wireless communication system. However, embodiments of the invention may be implemented in wired communications systems, in which case the transmission medium 30 may be a cable or a wire that connects the transmission system 20 to the reception system 40. Embodiments of the invention may also be implemented for storage systems, in which case the transmission medium 30 may be a magnetic tape or a hard disk drive or optical disk drive or solid state memory or other storage medium.

As will be apparent to those of ordinary skill in the art, input data 110 is ordinarily input into the transmission system 20 for eventual transmission to the reception system 40. A source encoder 120 compresses input data 110 so that the amount of data that must be transmitted is reduced. Data output from the source encoder 120 is then encoded by a channel encoder 130 which is configured according to description below. Such encoding renders the data to be transmitted more robust against errors that may be introduced during transmission across the transmission medium 30. In accordance with present principles, the channel encoder 130 implements a systematic encoder. After such encoding, the data is modulated by a modulator 140 and provided to a transmitter 150 for transmission through the transmission medium 30 to the reception system 40. The transmitter 150 has the task of converting information into signals capable of being transmitted across the transmission medium 30. For example, the transmitter 150 may be an RF radio transmitter with an antenna when the transmission medium 30 is airwaves or the transmitter 150 may be a laser device sending light into a fiber-optic cable.

The reception system 40 generally receives signals from the transmission medium 30 and demodulates and decodes them to extract the output data 195. With more specificity, a receiver 160 of the reception system 40 receives data front the transmission system 20 and passes the data to a demodulator 170, which demodulates the data. The demodulated data is then sent to a channel decoder 180 which produces a decoded data as an estimate of the transmitted data, and then the decoded data is sent to a source decoder 190 to decompress the data. It will readily be appreciated that the demodulator 170, channel decoder 180, and source decoder 190 perform the inverse of the operations performed by the modulator 140, channel encoder 130, and source encoder 120, respectively, subject to limitations imposed by noise effects and other non-idealities in the system. In any case, if the communication system 10 is properly designed and operated within its design parameters, extracted output data 195 should match the input data 110 with high reliability.

According to present principles, each component 120, 130, 140, and 150 of the transmission system 20 may be implemented on its own respective semiconductor chip, with the various chips communicating with each other according to the system of FIG. 1. Or, one semiconductor chip may bear multiple components of the transmission system. Such chips may implement a circuit of logic gates such as those described herein. Yet again, a processor such as a digital signal processor (DSP) accessing logic implemented in hardware or software may execute the function of one or more of the components of the transmission system 20. If in software, the software is stored on a computer readable storage medium such as but not limited to disk-based or solid state storage such that a machine such as a DSP executes method steps according to the logic. In any case, when the channel encoder 130 is implemented on a semiconductor chip, the circuitry of the chip establishes a coding circuit which defines a systematic encoder in accordance with description herein. Similarly, when the channel encoder is implemented by a processor accessing hardware- or software-embodied logic, the processor with logic establishes a circuit which defines a systematic encoder in accordance with description herein. A combination of the above implementations may be used. Likewise, the reception system 40 may be established by one or more semiconductor chips and/or processors accessing logic.

Figure 2:
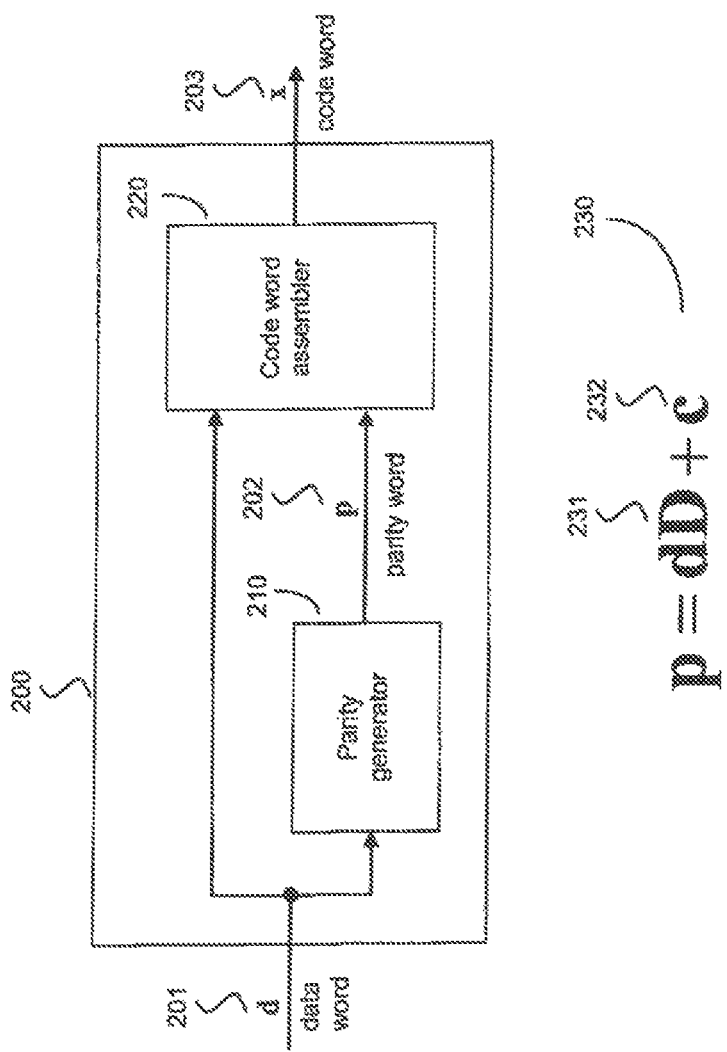
FIG. 2 is a schematic diagram of a systematic encoder in general.

Turning to FIG. 2, a simplified diagram of a systematic encoder 200 is shown which receives a data word d 201 and converts it to a code word x 203. The systematic encoder 200 includes a parity-generator 210 which takes the data word d as input and generates a parity word p 202 as output. A code word assembler 220 combines the data word d 201 and the parity word p 202 into the code word x 203. More specifically, the code word has a "systematic part" carrying the data word and a "parity part" carrying the parity word. Using the convention of representing words as row vectors over a field, present principles consider parity generators 220 that implement an affine transform $p = dD + c$ 230 between the data word d 201 and the parity word p 202, with the affine transform defined in terms of a parity-generator transform D 231 and an offset word C 232. In some implementations the offset word may be the all-zero word.

It is to be noted that the direct computation of an arbitrary affine transform p=dD+c 230 may be computationally prohibitive for many applications. If the parity-generator transform D 231 lacks any structure the complexity of computing the parity word p for a given data word d may be proportional to $N^2$, where N is the length of code words. Present principles give a relatively low-complexity method for computing the affine transform 230 under certain restrictions on the structure of the parity-generator transform D 231. In particular, present principles apply effectively when the parity-generator transform D 231 is derived from transforms defining polar codes. For polar codes, present principles describe a systematic encoding method with complexity order N log(N). Present methods are primarily but not exclusively directed to polar codes and their variants.

Attention is now turned to FIG. 3 which displays a certain type of systematic encoder 300 defined by four parameters:

a transform G 311, which is an N-by-N matrix, $G \in F_q^{M \times N}$, $G=(g_{i,j}: 1 \leq i \leq N, 1 \leq j \leq N)$;

a row index set A 312, which is a subset, of $\{1, 2, \ldots, N\}$ with K elements;

a column index set B 313, which is a subset of $\{1, 2, \ldots, N\}$ with K elements;

a fixed word b 314, which is a vector of length N−K, $b \in F_q^{N-K}$;

with a joint constraint on the parameters (G, A, B) that the matrix $G_{AB}=(g_{i,j}: i \in A, j \in B)$ has an inverse.

The systematic encoder (G, A, B, b) 300 receives a data word $d \in F_q^K$, computes the affine transform p=dD+c 333, and assembles the code word x by setting $x_B=d$ 334 and $x_{B^c}=p$ 335. The encoder 300 uses the parity-generator transform D defined by 331 and the offset word C defined by 332. Since the data word appears as part of the code word, this is a systematic encoder by construction. The part $x_B$ of the code word is the "systematic part", the part $X_{B^c}$ is the "parity part".

Theorem.

Let code C be the set of all code words generated by the systematic encoder (G, A, B, b) 300. For any code word $x \in C$, there exists a $u \in F_q^N$ with $u_A=b$ such that x=uG; in other words, the code C is an affine subspace of the range space of the transform G Proof.

Write the transform equation x=uG as $$[x_B, x_{B^c}] = [u_A, u_{A^c}] \begin{bmatrix} G_{AB} & G_{AB^c} \\ G_{A^cB} & G_{A^cB^c} \end{bmatrix} \quad \text{(Eq. 1)}$$

Taking $x_B$ and $u_{A^c}$ as independent variables, Eq. 1 can be solved to yield $$u_A = (x_B - u_{A^c} G_{A^c B})(G_{AB})^{-1} \quad \text{(Eq. 2)}$$

$$x_{B^c} = x_B (G_{AB})^{-1} G_{AB^c} + u_{A^c}[G_{A^c B^c} - G_{A^c B}(G_{AB})^{-1} G_{AB^c}] \quad \text{(Eq. 3)}$$

which are valid since $(G_{AB})^{-1}$ exists as part of the parameter constraints. Eq. 2 and Eq. 3 determine $(u_A, x_{B^c})$ uniquely in terms of any given $(X_B, u_{A^c})$. In particular, for $u_{A^c}=b$, Eq. 3 becomes $$x_{B^c} = x_B D + c \quad \text{(Eq. 4)}$$

where D and C are as defined by the rules 331 and 332, respectively. Eq. 4 is the same as the affine transform 333 defining the parity word p in terms of the data word d for the code C. Thus, the code C equals the set $$\{x \in F_q^N : x=uG, u_{A^c}=b, x_B \in F_q^K\}$$

which in turn equals the set $$\{x \in F_q^N : x=uG, u_{A^c}=b, u_A \in F_q^K\}$$

due to the fact that for any fixed $u_{A^c}$ there is one-to-one correspondence between $u_A$ and $x_B$ established by Eq. 2. The latter set is clearly an affine subspace of the range space of the transform G. This completes the proof.

Figure 4:
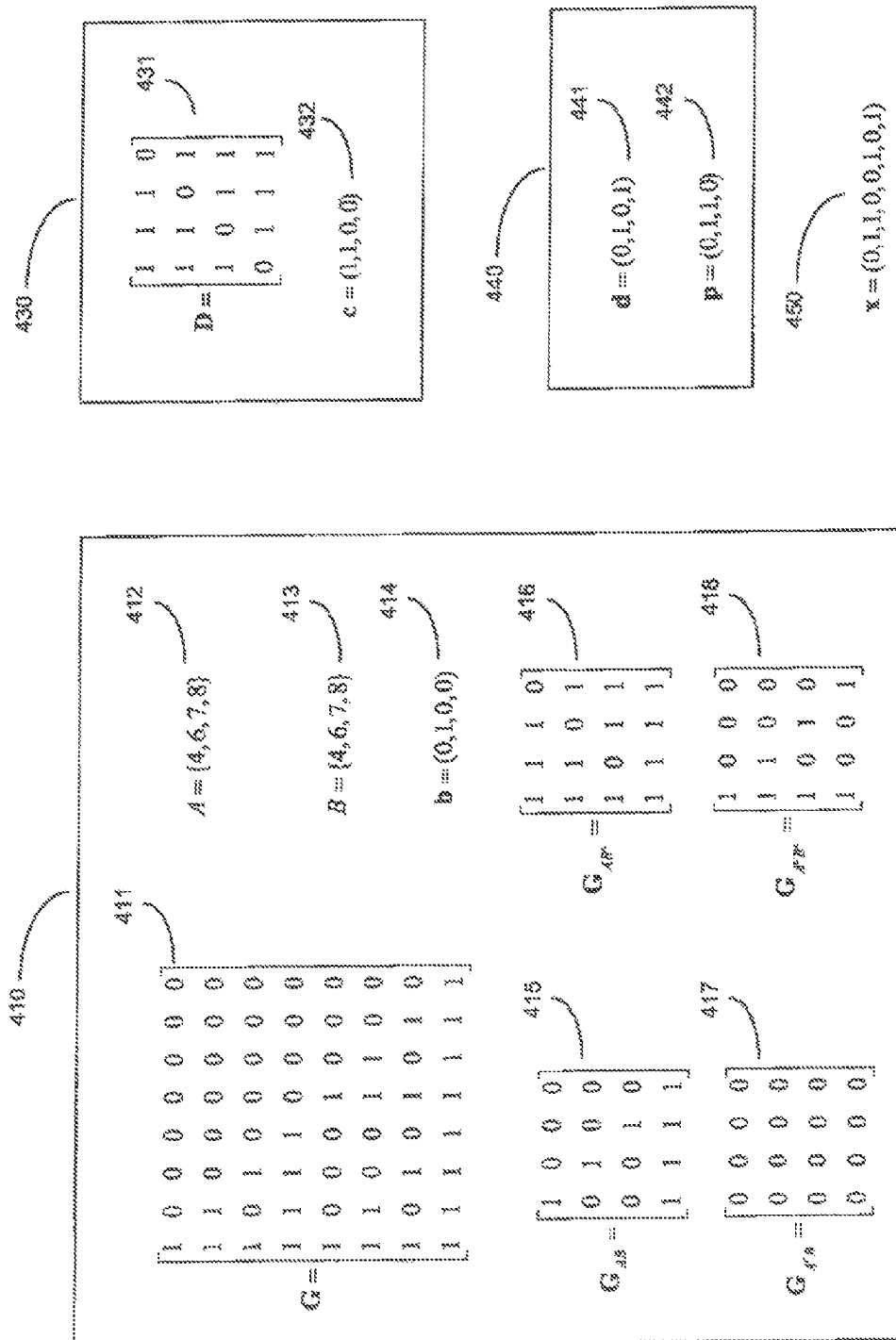
FIG. 4 is a schematic diagram showing a non-limiting example of the present systematic encoder described in FIG. 3.

In order to further illustrate the systematic encoder just described, cross-reference is made between FIGS. 3 and 4. FIG. 4 illustrates an example of systematic encoding in accordance with the rule described in FIG. 3. The parameters that define the systematic encoder are listed in the left side 410 of FIG. 4. Specific values are assigned to the elements of the parameter (G, A, B, b) by 411, 412, 413, and 414. The resulting submatrices of the transform G are displayed as $G_{AB}$ 415, $G_{AB^c}$ 416, $G_{A^cB}$ 417, and $G_{A^cB^c}$ 418; the resulting affine transform parameters D and C, as specified by 331 and 332, are displayed at 431 and 432. An instance of systematic encoding is shown at 440 where a data word d, as specified by the assignment 441, is encoded into a parity word p in accordance with the affine transform 333 and the resulting value is displayed at 442. The data word d and the parity word p are assembled into a code word x 450 in accordance with the rules 334 and 335 to complete the encoding operation.

For a more specific discussion of systematic encoders with structured transforms, turn to FIG. 5. Formula 510 defines a transform G as the Kronecker power of a kernel transform F. The term "kernel transform" refers to matrices that are used to construct transform matrices G by Kronecker product operations. Kernel transforms used in practice are usually small matrices. An example of a kernel transform is the 2-by-2 matrix shown at 520.

Transforms G that have a Kronecker power form as at 510 are commonly used in connection with polar codes, which is a class of codes for which present principles apply effectively. Transforms for polar coding may have more general structures than the Kronecker power structure shown at 510 and present principles can be used effectively for systematic encoding of more general polar code constructions.

It is noted that in some applications of polar coding the transform G is obtained by applying a row permutation or a column permutation (or both) to a Kronecker power of a kernel transform. For example it is common to use a "bit-reversal" permutation in polar coding. Present principles apply effectively for all such variations. More generally, present principles apply equally effectively for any two transforms G and G' that are related to each other by G=PG'Q where P and Q are arbitrary permutation matrices, i.e., matrices in which each column (row) contains a single 1 with all other entries in the column (row) being 0. In particular, present methods apply effectively for transforms G that can fee obtained from a lower triangular G' by permutations P and Q as in the preceding formula As recognized herein, the Kronecker power 510 can be written in the form $G=F \otimes G_1$ which expresses the transform G as a Kronecker product of the kernel transform F and a first-tier transform $G_1$ 511. The first-tier transform 511 in this instance also has a Kronecker power structure, $G_1=F^{\otimes(n-1)}$. The first-tier transform $G_1$ 511 may be factorized as $G_1=F \otimes G_2$ to obtain a second-tier transform $G_2=F^{\otimes(n-2)}$ 512, provided $n \geq 2$. Proceeding similarly, one obtains n trans forms $G_i=F^{\otimes(n-i)}$, $1 \leq i \leq n$. The transform G, obtained this way is called the "ith-tier transform" (in the Kronecker decomposition of the original transform G). The ith-tier transform is a $2^{n-i}$-by-$2^{n-i}$ matrix; its size decreases exponentially with i.

As recognized by present principles, the ability to factorize a transform into Kronecker products of smaller transforms is an important property for construction of low-complexity systematic encoders. In particular, as understood herein any code based on a transform that can be factors zed into a Kronecker product of a plurality of kernel transforms, such as $G=F_1 \otimes F_2 \otimes \ldots \otimes F_n$ 530 can benefit from present principles for constructing a low-complexity systematic encoder. For the more general case 530, the ith-tier transform can be obtained as $G_i = F_{i+1} \otimes \ldots \otimes F_n$ 531, $1 \le i \le n$. Essentially, using this principle of factorizing a given transform into a Kronecker product of smaller transforms the coding circuitry reduces an original systematic encoding problem instance into a number of first-tier systematic encoding problem instances. The number of first-tier problem instances equals the number of rows of the first-tier kernel transform $F_1$. In preferred embodiments of present principles the number of rows of the first-tier kernel transform $F_1$ is a small number, independent of the problem size.

This reduction of the original systematic encoding problem instance into successively higher-tier systematic encoding problem instances can continue recursively until a tier i is reached for which the ith-tier transform $G_i$ has no non-trivial Kronecker factorizations, i.e., for any factorization $G_1 = F_{i+1} \otimes G_{i+1}$ either where the size of $F_{i+1}$ is one or the size of $G_{i+1}$ is one. At this point, the systematic encoding problem instances for the ith-tier problems are solved by direct computation of the affine transform 333. Present principles exploit this recursive reduction of a given problem to smaller problems to me extent possible to obtain a low-complexity systematic encoder.

It is also to be noted that at 530 if each of the kernel, transforms $F_i$, $1 \le i \le n$, is lower-triangular with non-zero diagonal entries, then the transform G is also lower-triangular with non-zero diagonal entries. For any lower-triangular transform G with non-zero diagonal entries, the row index set A and the column index set B may be chosen equal (A=B) to obtain a sub-matrix $G_{AB} = G_{AA}$ that is lower-triangular with non-zero diagonal entries, ensuring that $G_{AB} = G_{AA}$ has an inverse.

It is recognized herein that having lower-triangular kernels $F_1$, $1 \le i \le n$, is advantageous for application of present principles. More generally, it is recognized that the method can be applied with the same advantages if each kernel transform $F_i$ is such that it can be brought into lower-triangular form by a series of row exchanges and column exchanges. For instance, a kernel transform $F_i$ that is originally upper-triangular can be brought into lower-triangular form by row and column exchanges. Embodiments of present principles are given below tor the case where the transforms are specified as lower-triangular transforms with non-zero diagonal entries for convenience and are non-limiting.

It is also recognized herein that transform matrices can be brought into more convenient forms for implementation by employing permutations. It is known that for any two matrices A and B, there exist permutations P such that Q such that $A \otimes B = P(B \otimes A)Q$. Thus, for example, a transform matrix that is originally in the form $G = G_1 \otimes F$ can be brought by a row permutation P and a column permutation Q into the form $PGQ = F \otimes G_1$ which may be more advantageous for implementation. In light of this fact, it is recognized that present principles can be used effectively for a broader class of transforms than the ones illustrated herein.

Figure 6A:
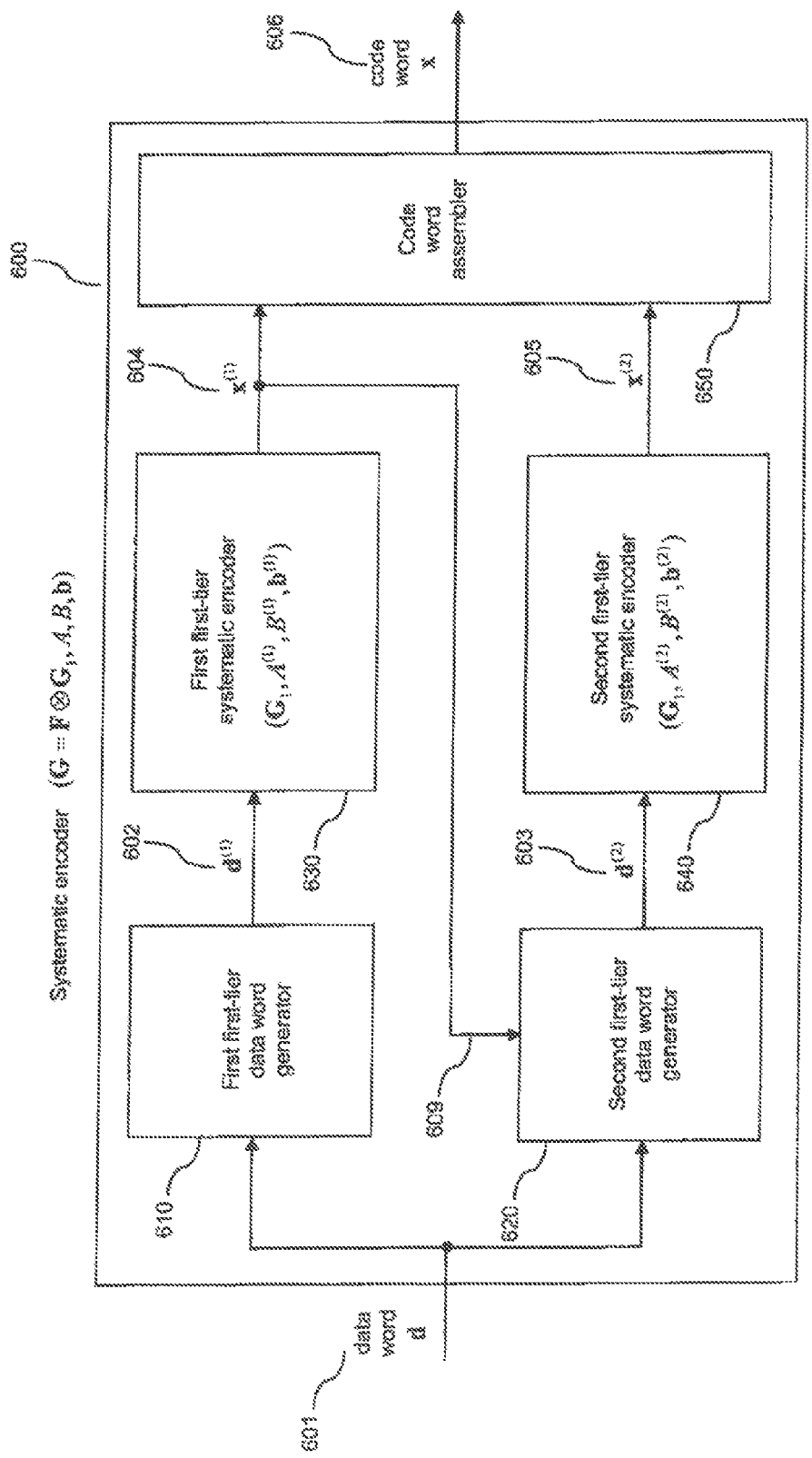

While still remaining within the general framework of FIG. 4, and guided by insight gained from the Kronecker product-form transforms in FIG. 5, now refer to FIG. 6A, which illustrates a systematic encoder $(G = F \otimes G_1, A, B, b)$ 600 where the kernel transform F is taken equal to the 2-by-2 matrix at 520 and $G_1$ a first-tier transform which may be arbitrary. The systematic encoder (G, A, B, b) 600 receives a data word d 601 and generates a code word x 606 in accordance with the general framework shown in FIG. 3. In other words, the systematic encoder 600 in effect computes an affine transform p=dD+c 333 with the parity-generator transform D and the offset word C derived from the parameter (G, A, B, b) by the formulas 331 and 333. However, rather than computing the affine transform 333 directly, present principles exploit the Kronecker product structure of the transform G to compute the affine transform 333 at lowered complexity. In FIG. 6, the systematic encoder 600 accomplishes this complexity reduction by breaking the original systematic encoding problem instance $(G = F \otimes G_1, A, B, b)$ into two smaller systematic encoding problem instances, a first first-tier problem instance to be solved by a first first-tier systematic encoder $(G_1, A^{(1)}, B^{(1)}, b^{(1)})$ 630 and a second first-tier problem instance to be solved by a second first-tier systematic encoder $(G_1, A^{(2)}, B^{(2)}, b^{(2)})$ 640. Further details of the systematic encoder 600 are as follows.

An encoding cycle begins with the systematic encoder 600 receiving a data word d 601 and terminates with the generation of a code word x 606. A first first-tier data generator 610 generates a first first-tier data word $d^{(1)}$ 602 as a function of the data word d 601. A second first-tier data word generator 620 generates a second first-tier data word $d^{(2)}$ 603 using the data word d 601 and a part of the first first-tier code word $x^{(1)}$ 604 supplied by a feedback link 609. In preferred embodiments of present principles, however, the second first-tier data generator 620 generates the second first-tier data word $d^{(2)}$ 603 from d 601 only, and the feedback link 609 becomes redundant and it can be eliminated from the circuit entirely, thereby reducing complexity and eliminating a latency caused by having to wait for the part of the first first-tier code word $x^{(1)}$ to become available at the output of the first first-tier systematic encoder output. The elimination of the feedback link 609 makes it possible to run the two first-tier encoders 630 and 640 in parallel.

The first first-tier data word $d^{(1)}$ 602 is processed by a first first-tier encoder $(G_1, A^{(1)}, B^{(1)}, b^{(1)})$ 620 to generate a first first-tier code word $x^{(1)}$ 604. The second first-tier data word $d^{(2)}$ 603 is processed by a second first-tier systematic encoder $(G_1, A^{(2)}, B^{(2)}, b^{(2)})$ 640 to generate a second first-tier code word $x^{(2)}$ 605. A code word assembler 650 assembles the code word x 606 using the first first-tier code word $x^{(1)}$ 604 and the second first-tier code word $x^{(2)}$ 605.

It is to be noted that an alternative code word assembler as a replacement for 650 is possible, with the alternative code word assembler assembling the data part of the code word x directly from the data word d and the parity part of the code word x from the parity parts of the first-tier code words.

It is noted that the two first-tier systematic encoders 630 and 640 may be implemented by direct computation of the affine transform 333, with the affine transform adapted to the parameter $(G_1, A^{(1)}, B^{(1)}, b^{(1)})$ in one computation and to $(G_1, A^{(2)}, B^{(2)}, b^{(2)})$ in the second. However, such a direct computation is costly and present principles seek to avoid direct computations of affine transforms by exploiting Kronecker factorizations whenever possible. Specifically, if the first-tier transform $G_1$ can be factorized into a non-trivial Kronecker product $G_1 = F \otimes G_2$ then the same principles described above for the encoder 600 can be applied to the first-tier systematic encoders 630 and 640 to reduce the complexity still further. This recursive reduction of a problem instance into smaller problem instances may be continued if the second-tier transform $G_2$ also factors into a non-trivial Kronecker product.

It will be clear to the skilled person in the art that the recursive reduction may be applied until a tier i is reached such that the ith-tier transform cannot be factored into a non-trivial Kronecker product. Each problem instance at this final level i may be solved by a direct computation of an affine transform 333, with the affine transform adapted to the parameters of that problem instance (namely, the transform 311, the row index set 312, the column index set 313, and the fixed word 314). Once all problem instances at the final level i are obtained, the ith-tier code words are combined to obtain the (i−1)th-tier code words, leading to a recursive combining of solutions, which terminates when eventually the first-tier code words are combined to yield the code word x.

It is further noted that a systematic encoding problem instance is trivial when the instance has a code rate K/N that equals 1; in this case, one can simply set x=d to accomplish systematic encoding without any further computation. It is important to detect the presence of rate-1 encoding instances to take advantage of such computational short-cuts. It may be that the original problem instance has a rate less than 1, K/N<1, but the first first-tier problem instance has rate 1, $K_1/N_1=1$; in this case, block 630 can be replaced with the direct assignment $x^{(1)}=d^{(1)}$, leading again to significant savings in computational complexity. More generally, in the course of running the algorithm recursively at successively higher order tiers, one can take advantage of this computational short-cut by detecting the occurrence of rate-1 encoding instances. Present principles call for incorporating such short-cuts into the control logic of the algorithms that are described herein, although such details are omitted in the illustration of the basic principles.

To illustrate an implementation of a systematic encoder in accordance with FIG. 6A, attention is now turned to FIG. 6B which specifies a set of rules for implementing the systematic encoder 600. The rules in FIG. 6B are applicable when the original systematic encoding problem instance is defined by a parameter of the form (G=F⊗$G_1$, A, B=A, b) where the kernel transform F is taken equal to the 2-by-2 matrix at 520. The code may be over any field $F_q$, with q≥2. Since the transform G as specified here is lower-triangular and has 1's on the diagonal, by selecting the row index set and the column index set equal (A=B) one ensures that $G_{AB}=G_{AA}$ has an inverse.

FIG. 6B states rules for deriving from a given systematic encoding problem instance two first-tier systematic encoding problem instances. The input arguments for the execution of the roles in FIG. 6B are the code parameter (G=F⊗$G_1$, A, B=A, b) and the data word d. These parameters define "the original problem". Alter the rules of FIG. 6B are executed, the outputs are: (i) a first first-tier systematic encoding problem instance defined by a first first-tier parameter ($G_1$, $A^{(1)}$, $B^{(1)}=A^{(1)}$, $b^{(1)}$) and a first first-tier data $d^{(1)}$ and (ii) a second first-tier parameter ($G_1$, $A^{(2)}$, $B^{(2)}=A^{(2)}$, $b^{(2)}$) and a second first-tier data word $d^{(2)}$.

The rules in FIG. 6B are stated by assuming that the code word x 606 has length N, the data word d 601 has length K, the fixed word b has length N−K, the transform G is an N×N matrix, the row index set A is a subset of {1, 2, . . . , N} with K elements, and the column index set B is the same as A. Rules 661 and 662 specify, respectively, a first first-tier row index set $A^{(1)}$ and a second first-tier row index set $A^{(2)}$. Rules 663 and 664 specify, respectively, a first first-tier column index set $B^{(1)}=A^{(1)}$ and a second first-tier column index set $B^{(2)}=A^{(2)}$. The length parameters ($N_1$, $K_1$) for the first first-tier systematic encoder problem instance are specified by rules 665 and 667. As defined above, $|A^{(1)}|$ denotes the number of elements in the set $A^{(1)}$. The length parameters ($N_2$, $K_2$) for the second first-tier systematic encoding problem instance are specified by rules 666 and 668. A first first-tier fixed word $b^{(1)}$ is specified by rule 669 which sets it equal to the last $(N_1-K_1)$ elements of the original fixed word b. (Recall that the notation [r, s] for any two integers r and S denotes the set of all integers i such that r≤i≤s.) A second first-tier fixed word $b^{(2)}$ is specified by rule 670 which sets it equal to the first $(N_2-K_2)$ elements of the original fixed word b. (Note that the two first-tier fixed words use all elements of the original fixed word b by splitting it into two disjoint parts.) A first first-tier data word $d^{(1)}$ is derived by a rule 681 from the original data word d, by setting $d^{(1)}$ equal to the last $K_i$ elements of d. A second first-tier data word $d^{(2)}$ is specified by a rule 682, which sets it equal to a difference (subtraction operation in the field $F_1$) of the first $K_2$ elements of the original data word d and a part $(x^{(1)})_{B^{(1)}}$ of the first first-tier code word $x^{(1)}$.

It is to be noted that if the first-tier transform has the form $G_1=F\otimes G_2$, the rules at FIG. 6B can be applied to each first-tier systematic encoding problem instance to create two second-tier systematic encoding problem instances from each first-tier instance.

While still looking at FIG. 6B, an illustrative example is given. Let the field be the binary field $F_{q=2}$. Let the parameter (G, A, B=A, b) for the original systematic encoding problem instance be as in FIG. 4, with parameter values assigned as at 411, 412, 413, 413 in that figure. It can be verified readily that G as specified by 411 equals $\mathbb{F}^{\otimes 3}$ with the kernel transform F as specified at 520. The length parameters for the original problem instance in this example are N=8 and K=4. The first-tier transform $G_1$ is given by $G_1=\mathbb{F}^{\otimes 2}$. For A={4, 6, 7, 8}, the rules 661 and 662 identify the first-tier row index sets as $A^{(1)}=\{1, 3, 4\}$ and $A^{(2)}=\{4\}$. The rules 663 and 664 identify the first-tier columns index sets as $B^{(1)}=A^{(1)}$ and $B^{(2)}=A^{(2)}$. The first-tier length parameters are determined as $N_1=N_2=4$, $K_1=3$, and $K_2=1$ in accordance with the rules 665-668. For the fixed word b=(0, 1, 0, 0), the first-tier fixed words are determined as $b^{(1)}=(0)$ and $b^{(2)}=(0, 1, 0)$ in accordance with the rules 669 and 670. The rule 681 derives, from the original data word d=(0, 1, 0, 1), the first first-tier data word $d^{(1)}=(1, 0, 1)$. In accordance with the general framework of FIG. 3 and more specifically in accordance with the rule 334, the first first-tier data word $d^{(1)}=(1, 0, 1)$ appears transparently in coordinates $B^{(1)}$ of the first first-tier code word $x^{(1)}$; more explicitly, for the case here, the encoding rule sets $(x^{(1)})_{B^{(1)}}=(x_1^{(1)}, x_3^{(1)}, x_4^{(1)})$ equal to $d^{(1)}$ yielding $(x^{(1)})_{B^{(1)}}=(1, 0, 1)$. Here, $B^{(2)}=\{4\}$ is a subset of $B^{(1)}=\{1, 3, 4\}$; thus, $(x^{(1)})_{B^{(2)}}$ is a part of $(x^{(1)})_{B^{(1)}}$ and hence the rule 682 can be applied immediately to set $d^{(2)}=(0)$. The first first-tier systematic encoding problem instance has the solution $x^{(1)}=(0, 1, 0, 1)$ (as can be verified by direct computation) and the second first-tier systematic encoding problem instance has the solution $x^{(2)}=(0, 0, 1, 1)$. These two code words are combined by rule 683 to obtain the code word x=(0, 1, 1, 0, 0, 1, 0, 1) as the solution of the original systematic encoding problem instance.

In the above illustrative example of FIG. 6B it was not specified how the two first-tier code words are obtained. The preferred method for solving the first-tier systematic encoding problem instances is to apply the same principles that were applied by the encoder 600 to solve the original systematic encoding problem, namely, to reduce the first-tier problems to second-tier problems by factoring the first-tier transform into a non-trivial Kronecker product if possible. In this example, the first-tier transform can be factored as $G_1=F\otimes G_2$ which gives a second-tier transform $G_2=F$. Thus, the method described above can now be applied to reduce each first-tier systematic encoding problem instance into a pair of second-tier systematic encoding problem instances. This recursive reduction stops at the second tier since the second-tier transform $G_2$ cannot be factored into a non-trivial Kronecker product. So, the affine transform 333 is applied directly to obtain the second-tier code words. Once the second-tier code words are obtained, they are combined by the rule 683 to obtain the first-tier code words; the first-tier code words in turn are combined by the rule 683 to obtain the code word x as the solution to the original systematic encoding problem instance.

Returning now to the more general case with insight gained from the above example, it is noted that present principles apply most effectively when the transform matrix is a Kronecker power $G = F^{\otimes n}$, as in standard polar coding. Then, the original systematic encoding problem instance for the transform G can be reduced recursively to systematic encoding problem instances at n−1 successive tiers. For each $1 \leq i \leq n-1$, there are $2^i$ ith-tier problem instances, each defined for an ith-tier transform $G_i = F^{\otimes(n-i)}$ with dimension $2^{n-i}$.

It is to be further noted that recursive reduction of an original systematic encoding problem instance to similar systematic encoding problem instances at higher order tiers and at exponentially decreasing sizes is an advantageous aspect of present principles that allows re-use of computational resources. For example, a single configurable systematic encoder implementation may be used to solve all systematic encoding problem instances generated by the recursive reduction of the original problem instance. Alternatively semi-parallel implementation architectures can be used that duplicate some of the resources that are re-used to achieve a desired trade-off between hardware complexity and latency.

It is further recognized that in some implementations where latency is important it is desirable to be able to run the two first-tier systematic encoders 630 and 640 in parallel; for this to be possible it is desirable that the step 620 generate the second first-tier data word $d^{(2)}$ 603 as a function of only the data word d 601 without having to wait for the first first-tier code word $x^{(1)}$ 604 to become available on the feedback line 609. A sufficient condition for this to be the case is to use a column index set B such that $B^{(2)} \subset B^{(1)}$, because then the coordinates of $x^{(1)}$ with indices in $B^{(2)}$ become known as soon as the data word d 601 becomes available. The latency reduction is especially significant if each problem instance created by the recursive reduction inherits this property. It is known to the skilled artisan that polar codes in their ordinary mode of implementation have the property of having $B^{(2)} \subset B^{(1)}$ at the first-tier and at all subsequent tiers; so as recognized herein, systematic encoders can be implemented using full parallelism to reduce the latency for systematic encoding of polar codes. A fully parallel implementation of a polar code is illustrated below in FIG. 7 where the latency is brought down to order log(N) while the memory utilization is of order N log(N).

The rules stated in FIG. 6B for implementing the systematic encoder 600 in FIG. 6A have been described in a manner suitable for software implementation on a computer with a single central processing unit. The rules in FIG. 6B are also suitable for hardware implementations that employ semi-parallel or fully-parallel processing. Continuing explanation in reference to FIGS. 7A, 7B, and 7C a sample fully parallel-ized hardware implementation of the systematic encoder 600 is shown using digital logic.

Figure 7A:
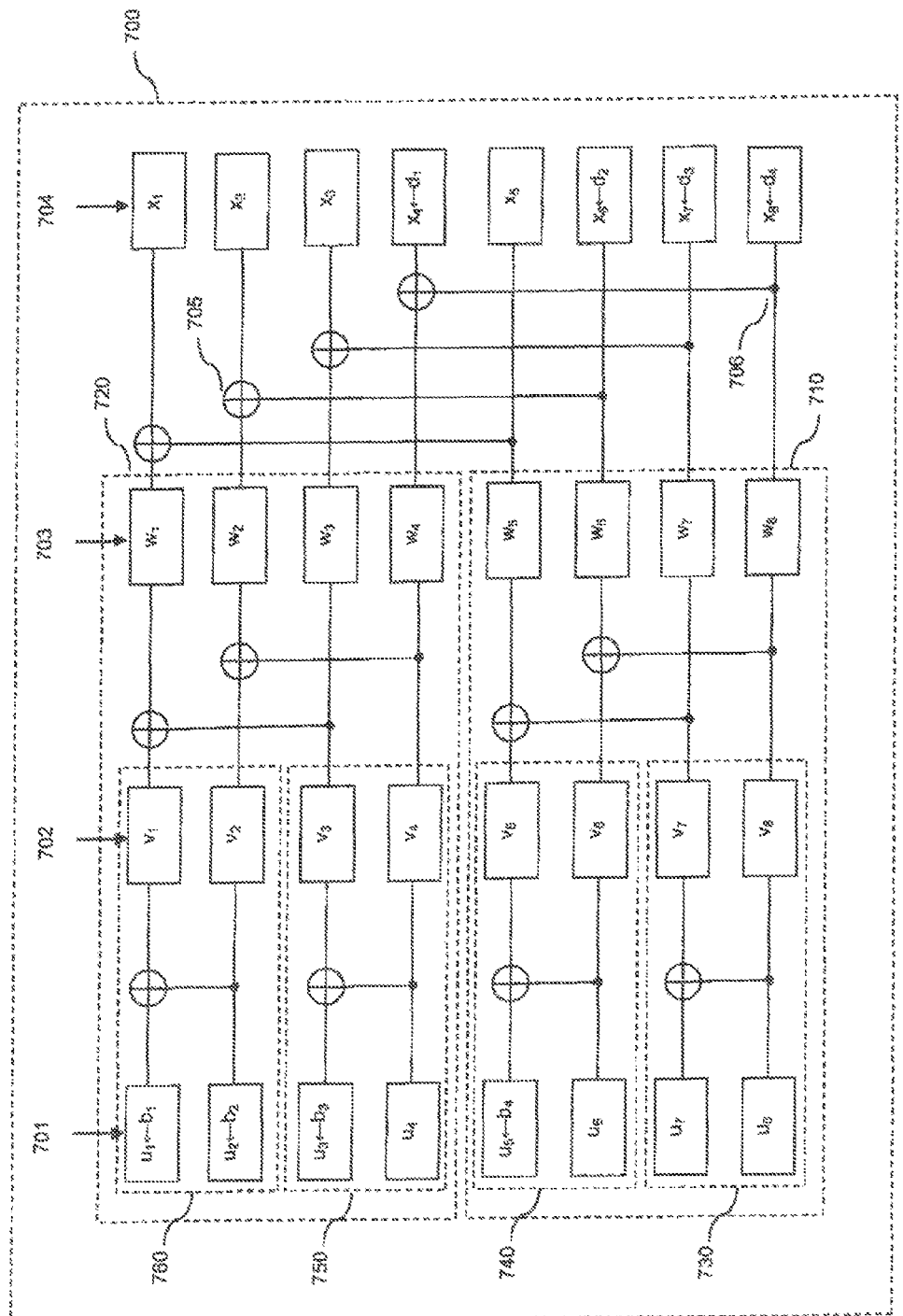

The non-limiting example circuit 700 in FIG. 7A is configured for a code with parameter $(G = F^{\otimes 3}, A, B, b)$ over the binary field $F_q$. The kernel transform F is the matrix given at 520. The circuit 700 is flexible enough to function as a systematic encoder for any choice of the row index set A, the column index set B, and the fixed word b. For illustrative purposes, here it is assumed that the code is over the binary field $F_{q=2}$ and the parameters are set as A={4, 6, 7, 8}, B=A, and b=(0, 1, 0, 0). The data word is assumed to be d=(0, 1, 0, 1). (With these choices, the example used here to illustrate the circuit 700 coincides with the examples used in FIG. 4 and FIG. 6B.)

The circuit 700 is designed for coding over the binary field $F_{q=2}$ with the exclusive-or gates 705 implementing the addition operation in $F_{q=2}$. Dots 706 in the figure show points where wires are connected to each other. The circuit 700 uses sequential logic with a clock. The circuit includes a memory which is arranged into various arrays. Each memory element in the circuit 700 can store either a 0 or a 1. Data can be written into memory elements at clock ticks. A data written into a memory element is maintained until a new data is written into that memory element.

Memory elements are used to keep track of various words used by the encoding algorithm, such as the data word, the parity word, and various other auxiliary words. Accordingly, the memory is partitioned into four arrays: an input array u 701, a first internal array v 702, a second internal array w 703, and a code word array x 704. (In general, the number of internal arrays will vary.) The input array u has a fixed part $u_{A^c}$ and a variable part $u_A$. The code word array has a data part $x_B$ and a parity part $x_{B^c}$. For the specific parameter choice here, these parts are as follows: $u_A=(u_4, u_6, u_7, u_8)$, $u_{A^c}=(u_1, u_2, u_3, u_5)$, $x_s=(x_4, x_6, x_7, x_8)$, and $x_{B^c}=(x_1, x_2, x_3, x_5)$.

Each memory element is either in state "known" or state "unknown". The state of a memory element at a given time signifies whether the value of the variable associated with that memory element is known or unknown at that time. As a mutational convention, the name of a memory element is also used to represent the value stored in it.

The values stored in "known" memory elements constitute the "existing knowledge" in the circuit. In each clock cycle, the circuit extracts "new knowledge" from the existing knowledge by determining values of some of the "unknown" memory elements using some "new knowledge extraction rules". The new knowledge extraction rules are based on "local constraints". The local constraints are typically derived from the kernel transform F. For the specific kernel transform F used in FIG. 7, the local constraints take the form of "butterfly" constraints. A butterfly constraint spans four memory elements $(\alpha_1, \alpha_2, \beta_1, \beta_2)$ such that (i) the first two memory elements $(\alpha_1, \alpha_2)$ are part of a first memory array (the input array, one of the internal arrays, or the output array), (ii) the third and fourth memory elements $(\beta_1, \beta_2)$ are part of a second memory array; (iii) in "known" state the values stored in the butterfly must satisfy $\beta_1 = \alpha_1 \oplus \alpha_2$ and $\beta_2 = \alpha_2$. This butterfly constraint is derived from the kernel transform F by regarding $\alpha = (\alpha_1, \alpha_2)$ as an input and $\beta = (\beta_1, \beta_2)$ as an output tor the transform operation $\beta = \alpha F$. An example of a butterfly constraint in circuit 700 is $(w_1, w_5, x_1, x_5)$.

FIG. 7B displays a table 770 of sixteen rules 771 that form an exhaustive list of all rules that can be used for new knowledge extraction using a butterfly constraint $(\alpha_1, \alpha_2, \beta_1, \beta_2)$. There is one rule in table 770 for each combination of states ("known" or "unknown") for each memory element in the butterfly. In table 770, the letters "K" and "U" are used as abbreviations for "known" and "unknown", respectively. For instance, the second rule, which is listed in the second row of the table, relates to the case in which $\alpha_1$ is "unknown", $\alpha_2$ is "unknown", $\beta_1$ is "unknown", and $\beta_2$ is "known". In this case, the unknown value of $\alpha_2$ is extracted from the known value of $\beta_2$. The notation "$\alpha_2 \leftarrow \beta_2$" indicates that the memory location $\alpha_1$ is updated with the value of $\beta_2$.

Existing knowledge in the circuit is initialized by loading a data word d into the data part $x_s$ of the code word array and the fixed word b into the fixed part $u_{A^c}$ of the input array. In this example, this results in having u=(0, 1, 0, d, 0, d, d, d) and x=(d, d, d, 0, d, 1, 0, 1) as the initial contents of the input array and the code word array, respectively. The symbol "d" stands for the "don't care" condition for a memory element and signifies that the corresponding memory location has not yet been filled in with a known value.

A state evolution, table 790 in FIG. 7C shows the evolution of the memory arrays in circuit 700 starting from the initial state at time 1 until the completion of encoding. The state evolution table 790 represents the state of memory at any time by an 8-by-4 array where individual memory arrays u, v, w, and x are shown in columns. Each columns lists the elements of an array in the natural index order, starting with the first element at the top. For visual clarity, the content of a memory element is shown "blank" if the "d" ("don't care") condition holds for that memory element.

The state evolution table 790 shows that initial existing knowledge is contained in the fixed part $u_{A^c}$ of the input array and the data part $x_B$ of the code word array. At each succeeding time, the state of memory evolves in accordance with the new knowledge extracted from the existing knowledge. It is observed from the state evolution table 790 that at time 2, the memory elements $v_1, v_2, w_4, w_5, w_7$, and $w_8$ are updated with new knowledge extracted from the state at time 1. The rules in the table 770 are used to extract the elements of the new knowledge. For example the element $w_8$ changes from "unknown" to "known" state at time 2 by applying the Rule 2 of the table 770 to the butterfly constraint $(w_4, w_8, x_4, x_8)$. As a second example, the memory elements $v_1$ and $v_2$ change from "unknown" to "known" at time 2 by applying the Rule 13 to the butterfly constraint $(u_1, u_2, v_1, v_2)$.

As seen in table 790, knowledge propagates from left-to-right and from right-to-left in each time period. At time 6 all memory elements become determined and the encoding is completed. The code word computed by the circuit is x=(0, 1, 1, 0, 0, 1, 0, 1) which contains the data word d in $x_B$ and the parity word p in the complementary part $x_{B^c}$; thus, the parities are p=(0, 1, 1, 0). It will be noticed that the result of this example agrees with the result obtained earlier by direct calculation of the parities as in FIG. 4 and by the recursive method of FIG. 6.

Looking at FIG. 7C, it is to be noted that the time at which a memory element changes from "unknown" to "known" does not depend on the particular data word d or the fixed word b; it depends only on the "pattern" of initial existing knowledge as determined by the sets A and B. Hence, a schedule of calculations can be prepared in advance so that the circuit 700 carries out new knowledge extraction in accordance with a pre-determined schedule irrespective of the particular values assigned to the fixed word b and the data word d. Using a pre-determined schedule of calculation is advantageous since it eliminates the need for searching for butterfly constraints from which new knowledge can be extracted. The size of such a predetermined schedule of calculations is the same as the number of elements in the memory, which is N log(N) for polar codes that are constructed using a transform G of the form 510.

An important feature of circuit 700 can be appreciated by recognizing that two subcircuits 710 and 720 are each designed to implement a first-tier transform $G_1 = F^{\otimes 2}$: first-tier subcircuits 710 and 720 are implementations, respectively, of steps 630 and 640 in FIG. 6. With more specificity, first-tier subcircuit 710 implements the transform $w' = u'G_1$ where $w' = (w_5, w_6, w_7, w_8)$ and $u' = (u_5, u_6, u_7, u_8)$; and $w'' = u''G_2$ where $w'' = (w_1, w_2, w_3, w_4)$ and $u'' = (u_1, u_2, u_3, u_4)$. In the same sense, the second-tier subcircuits 730, 740, 750, and 760 implement the second-tier transform $G_2 = F$. Thus, the circuit 700 lays out in hardware the full set of recursively-generated systematic encoding problem instances discussed above in connection with FIG. 6A. Thus, the circuit 700 can take advantage of parallelism to the fullest extent possible to reduce the computation time.

It is also to be noted that the two first-tier subcircuits 710 and 720 are independent of each other and identical in structure. Present principles recognize that this independent and identical nature of the first-tier subcircuits allows re-use of hardware resources. Present principles also recognize that the second-tier subcircuits 730, 740, 750, 760 are identical and independent; hence, there is room for further hardware re-use as one descends down the tiers. It will be apparent to the skilled person in the art that the architecture of the systematic encoder 600 presents a wide range of semi-parallel implementations options, the fully parallel implementation in circuit 700 being at one extreme and the fully serial implementation discussed in connection with the illustration of the rules in FIG. 6B being at the other extreme.

It is to be noted that time complexity of the systematic encoder circuit in FIG. 700 can be reduced if the calculations are stopped as soon as the parity part $x_{B^c}$ of the code word array becomes "known". In an extreme case when the code rate is 1, the entire code word array x is initialized with the data word d, and there is no need to do any calculations to extract new knowledge. This same remark applies also to the first-tier subcircuits; when a first-tier code word is determined, the new knowledge extraction within the corresponding first-tier subcircuit becomes unnecessary. Similar remarks apply to code words at ad tiers. Present principles envision a schedule of calculations that will take advantage of such computational short-cuts to reduce latency.

It Is to be noted that the encoder circuit can be reduced in size by "pre-extraction" of knowledge from the fixed part $u_{A^c}$ of the input array to enhance the initial existing knowledge. For this, the circuit 700 is initialized with the fixed word b but the data part $x_B$ is left uninitiated in the "unknown" state. New knowledge is extracted from the circuit in accordance with the same rules stated above word as much as possible and used as the initial knowledge when the circuit is used for encoding data. In the above example, such pre-extraction of knowledge would obtain $v_1 = 1$ and $v_2 = 1$. After pre-extraction, the memory elements $u_1$ and $u_2$ become redundant and can be eliminated to conserve memory, if desired. In general, pre-extraction of knowledge from the fixed word may reduce circuit size and reduce the number of calculations.

It is to be noted that present principles can be implemented by circuits of the form 700 in a variety of ways. The connections between the different layers of memory arrays can be made to look structurally identical by certain permutations; this brings advantages such as simplified layout for VLSI implementation or pipelining. The transform itself may be modified by using a bit-reversal permutation operation as is customary in standard polar coding. Such variations are well known to the skilled person in the art of polar coding. Present principles can be adapted for operation on such alternative circuits as will be clear to the skilled person in the art.

As will be readily understood in light of the above disclosure, circuits similar to the one shown in FIG. 7A can be constructed for computing the transform $F^{\oplus n}$ for any n≥1. Such a circuit contains (n+1) memory arrays of size $N=2^n$ each. The generalization of the circuit 700 for implementing the general transform $F^{\oplus n}$ with block-length $N=2^n$ contains N/2=$2^{n-1}$ butterfly constraints between any two adjacent memory arrays, tor a total of N $\log_2$(N) butterfly constraints.

It will be apparent to those skilled in the art that a circuit similar to the circuit 700 can be constructed to implement any transform of the form G=$F_1 \otimes \ldots F_n$. The general circuit can be constructed by using an input array u, a sequence of internal arrays $v_i$, 1≤i≤(n−1), and an output array x, each array having a length equal to the dimension (number of rows) of the transform G. The circuit would have local constraints based on the first kernel $F_1$ between the input array and the first internal array, local constraints based on the ith kernel transform $F_i$ between the (i−1)th internal array and the ith internal array for 2≤i≤(n−1), and local constraints based on the nth kernel transform $F_n$ between the (n−1)th internal array and the code word array x.

Figure 8:
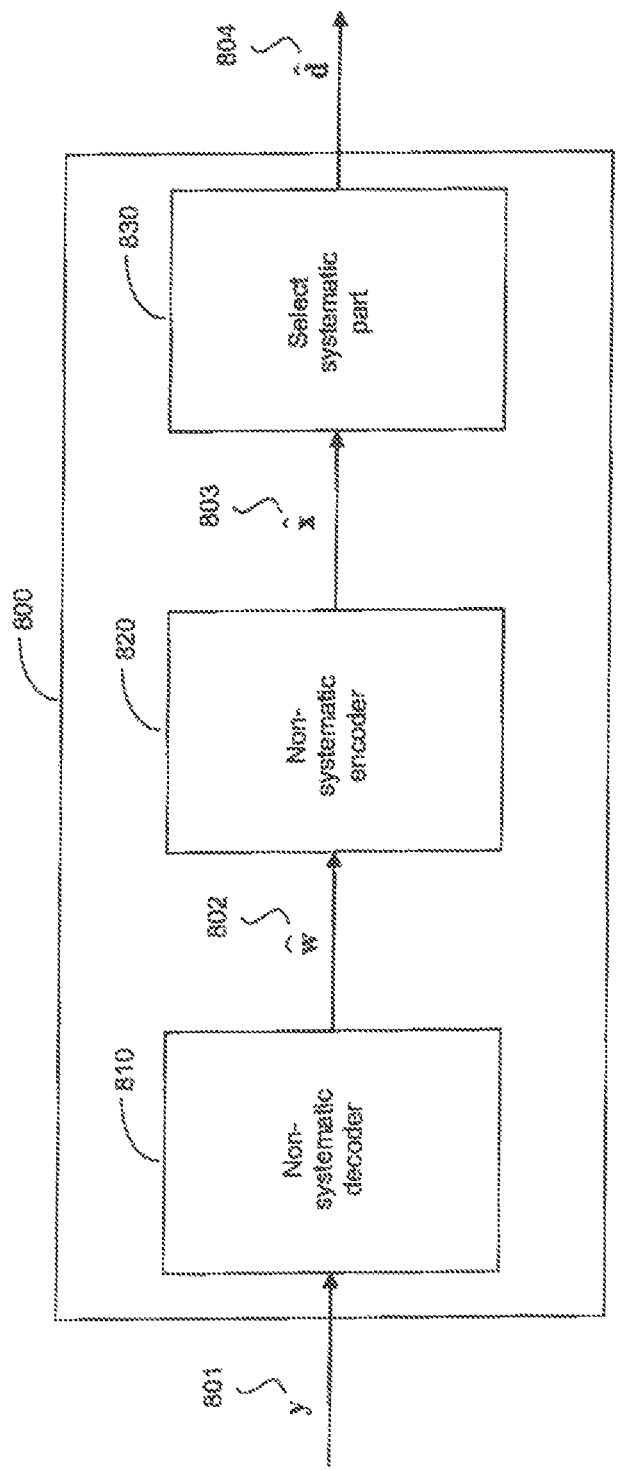
FIG. 8 is a schematic diagram showing a general architecture for a decoder for systematic codes that uses, as a component, a decoder for non-systematic codes.

Turning to FIG. 8, a systematic decoder 800 is disclosed that can be used as the channel decoder 180 for decoding the codes generated by a systematic encoder. A scenario for the beneficial use of the systematic decoder 800 is as follows. A data word d is used by a systematic encoder to encode the data word into a code word x of a code C. The encoding is systematic hence there exists a subset of coordinates B such that $x_B$=d. The code word is sent over a noisy channel and a channel output word y 801 is received which is given to the systematic decoder. The systematic decoder is expected to generate an estimated data word d 804 that matches the data word d. Rather than directly decoding for code C, the systematic decoder 800 employs a non-systematic decoder 810 designed tor a non-systematic code $\tilde{C}$. The code $\tilde{C}$ is such that it has the same set of code words as the systematic code C hot uses a different mapping from data words to code words. Accordingly the decoder 800 disclosed herein has as its first stage the non-systematic decoder 810 which generates an estimated non-systematic data word ŵ 802. The decoder 800 has as its second stage a non-systematic encoder 820 designed for the non-systematic code $\tilde{C}$. The non-systematic encoder 820 encodes the estimated non-systematic data word ŵ to obtain an estimated non-systematic code word x̂ 803. In the final stage, the systematic decoder 800 employs a selector 830 which outputs an estimated systematic data word d̂ by setting d̂=$\hat{x}_B$. It will be apparent to the skilled person in the art that if the system is properly designed and operated within feasible limits as determined by factors such as the severity of noise in the channel, then the estimated systematic data word d̂ will match the systematic data word d with high probability.

The architecture of the systematic decoder 800 is advantageous especially in connection with polar coding for which low-complexity non-systematic decoders are available. An example of a low-complexity non-systematic decoding algorithms that can be used to implement the decoder block 810 for polar codes is the successive cancellation decoding algorithm.

Figure 9:
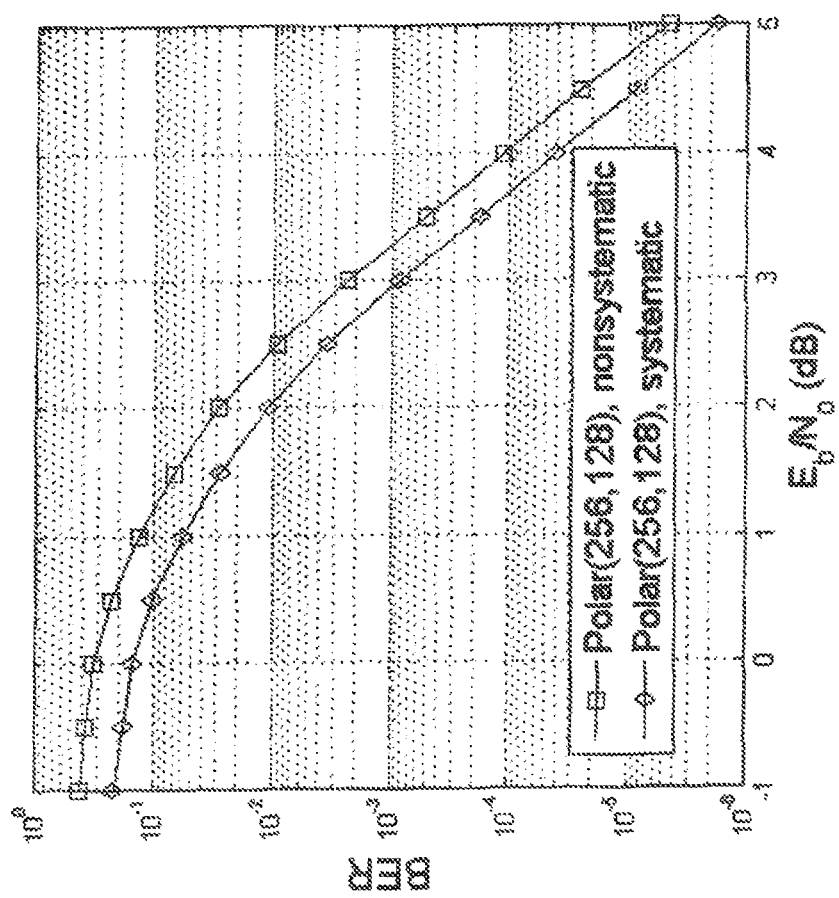
FIG. 9 is a plot of BER versus SNR for systematic and non-systematic polar codes showing the superior performance obtained by systematic polar coding.

The significantly superior bit-error rate (BER) performance of systematic polar codes can be appreciated in reference to FIG. 9, illustrating that systematic polar codes are more robust to propagation of decision errors by the decoder. The better BER performance of systematic polar codes is especially pronounced in the low signal-to-noise ratio (SNR) regime, where the system is operated close to the Shannon limit. For high efficiency, it is desirable to operate systems near the Shannon limit to the extent possible; in this sense, systematic polar coding is an improved mode of implementing a polar code. Another advantage of systematic polar coding is its suitability for being included in a concatenated coding scheme whereby an external code such as a BCH code (for its inventors, Bose, Ray-Chaudhuri, and Hocquenghem) or Reed-Solomon code cleans up the residual bit errors left over by an inner polar code. Doe to the reduced BER, a systematic polar code can be used in a more advantageous manner than a non-systematic polar code in such concatenated coding schemes.

With more specificity, FIG. 9 shows the BER vs. SNR for systematic and non-systematic polar codes. This figure has been obtained by simulating polar codes using binary phase-shift keying (BPSK) modulation on an additive white gaussian noise (AWGN) channel. The SNR is measured by the ratio of signal bit energy $E_0$ normalized by noise power spectral density $N_0$. The figure shows a clear performance advantage for systematic polar codes. The advantage is especially pronounced at low SNR where the system operates near the Shannon limit (around 0 dB here).

While the particular METHOD AND SYSTEM FOR ERROR CORRECTION IN TRANSMITTING DATA USING LOW COMPLEXITY SYSTEMATIC ENCODER is herein shown and described in detail, it is to be understood that the subject matter which is encompassed by the present invention is limited only by the claims.

What is claimed is:

1. A systematic encoder assembly of low complexity comprising:
   input receiving data symbols sought to be transmitted;
   the assembly accessing at least one fixed word that does not change from transmission to transmission;
   circuit receiving the data symbols and the at least one fixed word and using at least portions of the data symbols to define at least systematic parts of code words;
   the circuit using at least portions of the fixed word to define at least a fixed part of an input word, the input word establishing at least in part a parity part of a code word; and
   the circuit outputting, for transmission, code words transparently encapsulating data symbols and including respective parity parts a transmitter receiving the code words and transmitting the code words through a transmission medium to a receiver.

2. The systematic encoding assembly of claim 1, wherein the encoding assembly is implemented by an electrical circuit including logic gates and memory arrays.

3. The systematic encoding assembly of claim 1, wherein the encoding assembly is implemented by a processor accessing a computer readable storage medium storing instructions executable by the processor to implement a systematic encoder.

* * * * *